(12) United States Patent
Li et al.

(10) Patent No.: US 9,583,815 B2
(45) Date of Patent: Feb. 28, 2017

(54) ORGANIC ELECTROLUMINESCENT DISPLAY DEVICE HAVING INTEGRATED NFC ANTENNA

(71) Applicant: Truly Semiconductors Ltd., Guangdong (CN)

(72) Inventors: Jianhua Li, Guangdong (CN); Xuebin Chen, Guangdong (CN)

(73) Assignee: TRULY SEMICONDUCTORS LTD., Shanwei, Guangdong (CN)

( * ) Notice: Subject to any disclaimer, the term of this patent is extended or adjusted under 35 U.S.C. 154(b) by 191 days.

(21) Appl. No.: 14/389,326

(22) PCT Filed: Feb. 6, 2013

(86) PCT No.: PCT/CN2013/071426
§ 371 (c)(1),
(2) Date: Sep. 29, 2014

(87) PCT Pub. No.: WO2013/149515
PCT Pub. Date: Oct. 10, 2013

(65) Prior Publication Data
US 2015/0022081 A1    Jan. 22, 2015

(30) Foreign Application Priority Data

Apr. 6, 2012  (CN) .................... 2012 2 0145136 U
Jul. 5, 2012   (CN) .......................... 2012 1 0232600

(51) Int. Cl.
*H01Q 1/22*   (2006.01)
*H05B 33/08*  (2006.01)
(Continued)

(52) U.S. Cl.
CPC ......... *H01Q 1/2283* (2013.01); *G02F 1/1368* (2013.01); *G02F 1/13306* (2013.01);
(Continued)

(58) Field of Classification Search
CPC ...... H01Q 1/44; H01Q 1/2266; H01Q 1/2283; H01Q 1/2258; H01Q 1/22; H01Q 1/40;
(Continued)

(56) References Cited

U.S. PATENT DOCUMENTS 8,947,627 B2 *   2/2015  Rappoport .................... 349/149
2009/0137204 A1 * 5/2009  Chang ...................... H04B 5/00
                                                              455/41.1
2011/0053556 A1   3/2011  Masaryk

FOREIGN PATENT DOCUMENTS

CN   201215827 Y   1/2009
CN   202068693 U   7/2011
(Continued)

OTHER PUBLICATIONS

International Search Report mailed May 16, 2013, International Application No. PCT/CN2013/071426.

*Primary Examiner* — Daniel D Chang
(74) *Attorney, Agent, or Firm* — Knobbe Martens Olson & Bear LLP

(57) ABSTRACT

An organic electroluminescent display device having integrated an NFC antenna (9). The NFC antenna is arranged on a display screen of the organic electroluminescent display device, where the NFC interface is equipped with an output line of the display screen and is connected to a control mainboard of the display screen. This combines the display screen and the NFC antenna (9) into one, and has the NFC antenna (9) provided directly on the organic electroluminescent display device, thus preventing the problem of signal quality deterioration and reception failure due to wearing of the NFC antenna (9) interface and inaccurate alignment. In addition, provided is a solution to facilitate reception of an NFC signal from a display panel of the display device or for when the NFC signal must be received from the display panel of the display device.

16 Claims, 3 Drawing Sheets

(51) Int. Cl.
*H01Q 1/50* (2006.01)
*H01Q 1/40* (2006.01)
*H01Q 7/00* (2006.01)
*H01Q 1/44* (2006.01)
*H01L 27/32* (2006.01)
*H04B 5/00* (2006.01)
*G02F 1/1333* (2006.01)
*G02F 1/1335* (2006.01)
*G02F 1/1368* (2006.01)
*H05K 1/18* (2006.01)
*G02F 1/133* (2006.01)
*G02F 1/167* (2006.01)
*G09G 3/34* (2006.01)
*H01L 27/12* (2006.01)

(52) U.S. Cl.
CPC .... *G02F 1/13338* (2013.01); *G02F 1/133345* (2013.01); *G02F 1/133512* (2013.01); *G02F 1/133514* (2013.01); *G02F 1/167* (2013.01); *G09G 3/344* (2013.01); *H01L 27/124* (2013.01); *H01L 27/323* (2013.01); *H01L 27/3225* (2013.01); *H01Q 1/22* (2013.01); *H01Q 1/2258* (2013.01); *H01Q 1/2266* (2013.01); *H01Q 1/40* (2013.01); *H01Q 1/44* (2013.01); *H01Q 1/50* (2013.01); *H01Q 7/00* (2013.01); *H04B 5/0081* (2013.01); *H05B 33/0896* (2013.01); *H05K 1/181* (2013.01); *H05K 1/189* (2013.01); *G09G 2370/00* (2013.01); *H05K 2201/10098* (2013.01); *H05K 2201/10151* (2013.01)

(58) Field of Classification Search
CPC ............ H04B 5/0081; G02F 1/133345; G02F 1/13338; G02F 1/133512; G02F 1/133514; G02F 1/1368; G02F 1/13306; G02F 1/167; H05K 1/181; H05K 1/189; H05K 2201/10098; G09G 3/344; G09G 2370/00
USPC .................... 315/34, 151; 345/104; 455/41.1
See application file for complete search history.

(56) References Cited

FOREIGN PATENT DOCUMENTS

| CN | 102479995 A | 5/2012 |
|---|---|---|
| CN | 102751309 A | 10/2012 |
| JP | 2010-102531 A | 5/2010 |
| WO | WO 2009/014366 A2 | 1/2009 |

* cited by examiner

ORGANIC ELECTROLUMINESCENT DISPLAY DEVICE HAVING INTEGRATED NFC ANTENNA

This application is a National Stage application of PCT international application PCT/CN2013/071426, filed on Feb. 6, 2013 which claims the priority to Chinese Patent Application No. 201220145136.8, entitled "DISPLAY SCREEN", filed with the State Intellectual Property Office of People's Republic of China on Apr. 6, 2012 and Chinese Patent Application No. 201210232600.1, entitled "ORGANIC LIGHT-EMITTING DIODE DISPLAY INTEGRATED WITH NFC ANTENNA", filed with the State Intellectual Property Office of People's Republic of China on Jul. 5, 2012, which are hereby incorporated by reference in their entireties.

FIELD

The disclosure relates to the technical field of near field communication, and particularly to an Organic Light-emitting Diode display integrated with an NFC antenna.

BACKGROUND

The Near Field Communication (NFC) technology is an essential technology for the future electronic products and has a huge market. An antenna of a conventional NFC product is mainly provided on a certain side of a cell or is attached inside a housing. Generally, coils formed through a metallic wiring are provided on a Printed Circuit Board (PCB) or on a Flexible Printed Circuit (FPC), and then the PCB or the FPC having the coils is attached on the cell or the housing. Main problems of the above antenna are described as follows. Abrasion or misalignment is easy to occur at a wiring junction of the NFC antenna due to repeated dismantlement and mounting of the cell and the housing, resulting in the deterioration of antenna signal quality and affecting the use of a function of the NFC product. In addition, since the antenna of the NFC product is generally located inside the housing, transmission of an NFC signal may be affected if the housing is made of a metallic material. Thus sturdy metallic materials are excluded when selecting the material for the housing of the electronic product.

For example, the above problems present in many electronic products mounted with an NFC antenna and an Organic Light-emitting Diode (OLED) display. The OLED display is a new panel display having advantages such as active luminescence, high contrast, fast response and light weight, and is regarded as a next generation display displacing the Liquid Crystal Display (LCD). The luminescence principle of the OLED is that, various function layers, including a charge injection layer, a charge transport layer and a light-emitting layer, are interposed between a positive electrode and a negative electrode; and the OLED may emit light by applying a proper voltage on the electrodes.

Since the NFC antenna is not reasonably arranged in the electronic product mounted with the NFC antenna and the OLED display, abrasion or misalignment is easy to occur at the wiring junction of the NFC antenna, thereby resulting in deterioration of antenna signal quality and restricting selectable materials for the housing of the electronic product. Since the OLED display is integratable with the NFC antenna during the progress of manufacturing the OLED display, there is a need to design a new OLED display integrated with an NFC antenna to solve the above problems.

SUMMARY

In view of the above, the disclosure intends to provide an OLED display integrated with an NFC antenna, which may prevent abrasion or misalignment at a wiring junction of the antenna and is advantageous to ensure the quality of an antenna signal. In addition, for the electronic product mounted with the above OLED display, a signal is transmitted from a front surface of the display; hence, a selection of materials for a housing is not limited by the NFC antenna.

To solve the above problems, a technical solution provided in the disclosure is as follows. An OLED display integrated with an NFC antenna is provided. The NFC antenna is provided on a display screen of the OLED display. An NFC interface is built in an output line of the display screen and is connected to a control mainboard for the display screen.

Preferably, the display screen includes a protective member, a first electrode, an organic luminescent functional layer, a second electrode, and a transparent substrate which are successively arranged, and the NFC antenna is led to the output line of the display screen via a conductive material.

Preferably, the NFC antenna is provided on an inner surface of the transparent substrate.

Preferably, the NFC antenna is provided on an outer surface of the transparent substrate and is covered with an insulation protective film.

Preferably, the NFC antenna is provided on an outer surface of the protective member and is covered with an insulation protective film.

Preferably, the NFC antenna is provided on an inner surface of the protective member.

Preferably, the NFC antenna is provided on an outer surface of the first electrode and is insulated from the first electrode by an insulation protective film.

Preferably, the NFC antenna is connected to the output line via a conductive material.

Preferably, the NFC antenna includes multiturn coils formed through a wiring with a conductive material.

Preferably, the multiturn coils are wound to have a rectangular shape, a circular shape, or other annular shapes matching with an outline of a product.

Preferably, a layer of transparent ferrite material is covered on a side of the multiturn coils, the side of the multiturn coils being closer to an inner side of the display.

As compared with conventional technologies, in the OLED display integrated with the NFC antenna provided in the disclosure, the NFC antenna is directly made on the OLED display. The NFC interface of the NFC antenna is built in the output line of the display screen and is connected to the control mainboard. Since the NFC antenna is fixed and is not dismantled and mounted frequently once being mounted, the problems of signal deterioration and reception failure due to abrasion or misalignment at the junction are prevented. In addition, a solution is provided for advantageously receiving an NFC signal from a display surface of the display, or for a case that the NFC signal should be received from the display surface of the display. Furthermore, for the electronic product mounted with the above OLED display, the signal is transmitted from a front surface of the display; hence, a selection of materials for a housing is not limited by the NFC antenna.

BRIEF DESCRIPTION OF THE DRAWINGS

In FIG. 1a to FIG. 5, associated reference numbers are described as follows:

1 represents a protective member; 2 represents a first electrode; 3 represents an organic luminescent functional layer; 4 represents a second electrode; 5 represents an insulation protective film (layer); 6 represents a substrate; 7 represents an output line; 8 represents a conductive silver paste; and 9 represents an NFC antenna.

DETAILED DESCRIPTION OF THE EMBODIMENTS

A basic conception of the disclosure is given as follows. An NFC antenna is provided on a display screen of an OLED display, where an NFC interface of the NFC antenna is built in an output line of the display screen and is connected to a control mainboard for the display screen.

The disclosure is further described in detail in conjunction with drawings and embodiments, for making technical solutions of the disclosure better understood by those skilled in the art.

A First Embodiment

Figure 1A:
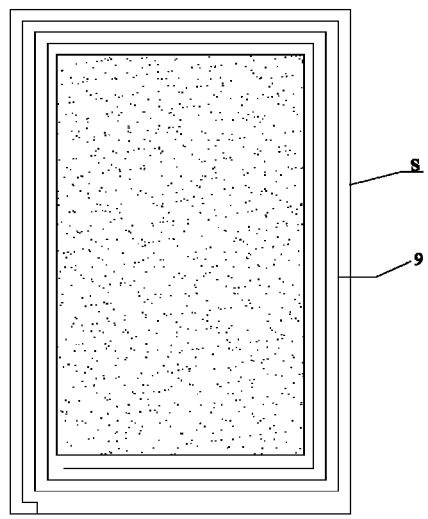
FIG. 1a is a front view of a mounting position of an NFC antenna on a display screen of an OLED display integrated with the NFC antenna according to a first embodiment of the disclosure.
Figure 1B:
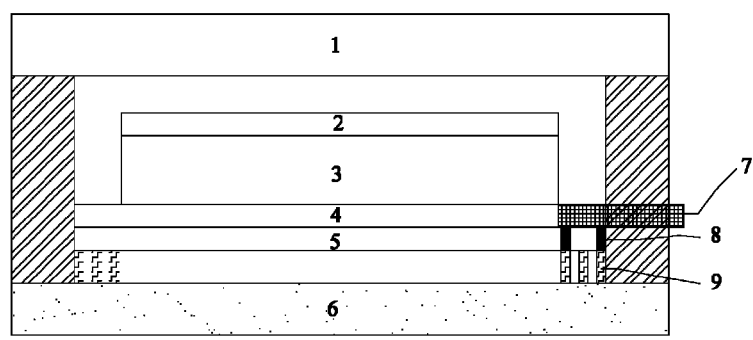
FIG. 1b is a schematic diagram of a mounting structural of the NFC antenna in the OLED display integrated with the NFC antenna according to the first embodiment of the disclosure.

FIG. 1a and FIG. 1b show a mounting structure of an NFC antenna in an OLED display integrated with the NFC antenna according to a first embodiment of the disclosure. A display screen S of the OLED display integrated with the NFC antenna includes a protective member (which may be a combination of a rear cover and a desiccant, or may be a thin film encapsulation), a first electrode 2 (which is generally a transparent electrode), an organic luminescent functional layer 3 (which generally includes an electron injection layer, a luminescent material and a hole injection layer), a second electrode 4 which is generally a transparent positive electrode, an insulation protective film 5, and a transparent substrate 6, which are successively arranged. The transparent substrate 6 is generally made of a glass. The second electrode 4 is generally an ITO transparent conductive thin film, and an output line 7 is led by the second electrode 4. The first electrode 2 is generally made of Al, Ag, Mg or an alloy. The rear cover in the protective member is generally a glass rear cover. A packaging glue (not illustrated in FIG. 1a and FIG. 1b) between the rear cover and the transparent substrate 6 is generally a UV glue. Specifically, the transparent substrate 6 and the rear cover is adhesively encapsulated by the packaging glue, the first electrode 2 and the second electrode 4 are provided in an inner chamber, and the organic luminescent functional layer 3 is interposed between the two electrodes.

A specific position of the NFC antenna 9 is showed in FIG. 1b. The NFC antenna 9 is provided on an inner surface of the transparent substrate 6. The insulation protective film 5 is provided between the transparent substrate 6 and the second electrode 4. The NFC antenna 9 includes multiturn coils formed through a wiring with metallic materials (such as silver, copper and alumina) or with other materials having low resistivities (such as carbon), and is connected to the output line 7 via a conductive silver paste 8 or via other conductive materials. The multiturn coils are wound to have a rectangular shape, a circular shape, or other annular shapes matching with an outline of a product. A layer of transparent ferrite material is applied (covered) on a side of the multiturn coils, the side of the multiturn coils being closer to an inner side of the display, to enhance the magnetic induction density. This type of wiring may be achieved with existing devices while no new investment is required.

Furthermore, an antenna matching circuit (not shown in FIGS. 1a and 1b) electrically connected to the NFC antenna 9 is provided. The antenna matching circuit includes a charge and discharge module and an impedance module, and the charge and discharge module is connected to the impedance module. The charge and discharge module includes capacitors connected in series or in parallel. The impedance module includes resistors connected in series or in parallel. Therefore, a power matching of the NFC antenna 9 is achieved by setting the antenna matching circuit.

A Second Embodiment

Figure 2:
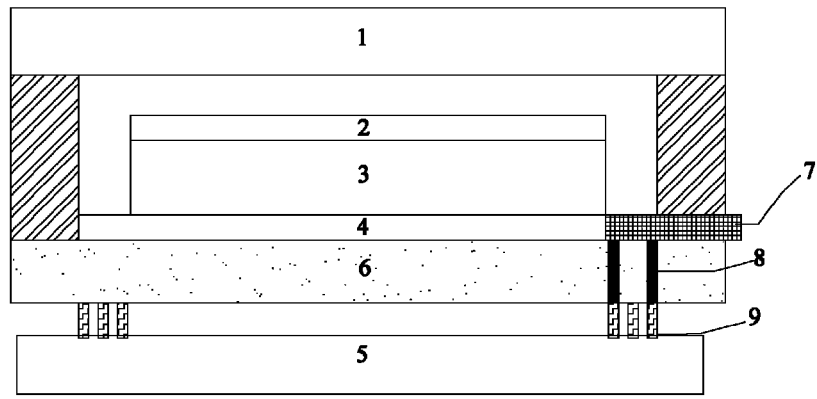
FIG. 2 is a schematic diagram of a mounting structural of an NFC antenna in an OLED display integrated with the NFC antenna according to a second embodiment of the disclosure.

FIG. 2 shows a mounting structure of an NFC antenna in an OLED display integrated with the NFC antenna according to a second embodiment of the disclosure. The NFC antenna 9 is provided on an outer surface of the transparent substrate 6. Thus, there is no need to provide the insulation protective film 5 between the transparent substrate 6 and the second electrode 4, and the insulation protective film 5 covers the outer side of the NFC antenna 9. The NFC antenna 9 includes multiturn coils formed through a wiring with metallic materials (such as silver, copper and alumina) or with other materials having low resistivities (such as carbon), and is connected to the output line 7 via the conductive silver paste 8 or other conductive materials. Other structures are same as those of the first embodiment, which are not detailed herein.

A Third Embodiment

Figure 3:
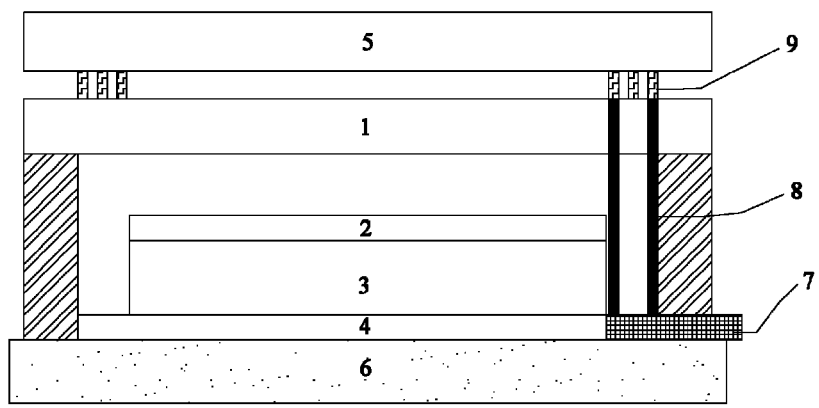
FIG. 3 is a schematic diagram of a mounting structural of an NFC antenna in an OLED display integrated with the NFC antenna according to a third embodiment of the disclosure.

FIG. 3 shows a mounting structure of an NFC antenna in an OLED display integrated with the NFC antenna according to a third embodiment of the disclosure. The NFC antenna 9 is provided on an outer surface of the protective member 1, and the insulation protective film 5 covers the outer side of the NFC antenna 9. The NFC antenna 9 is connected to the output line 7 via the conductive silver paste 8 or other conductive materials. The desiccant is not provided. Other structures are same as those of the second embodiment, which are not detailed herein.

A Fourth Embodiment

Figure 4:
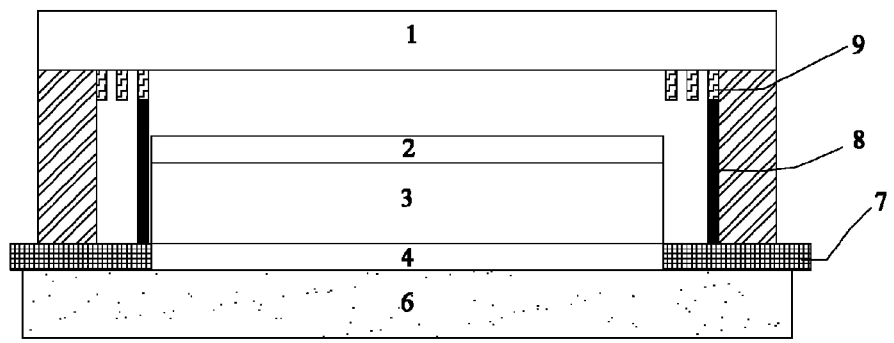
FIG. 4 is a schematic diagram of a mounting structural of an NFC antenna in an OLED display integrated with the NFC antenna according to a fourth embodiment of the disclosure.

FIG. 4 shows a mounting structure of an NFC antenna in an OLED display integrated with the NFC antenna according to a fourth embodiment of the disclosure. The NFC antenna 9 is provided on an inner surface of the protective member 1. The NFC antenna 9 is connected to the output line 7 via the conductive silver paste 8 or other conductive materials. The desiccant and the insulation protective film 5 are not provided. Other structures are same as those of the third embodiment, which are not detailed herein.

A Fifth Embodiment

Figure 5:
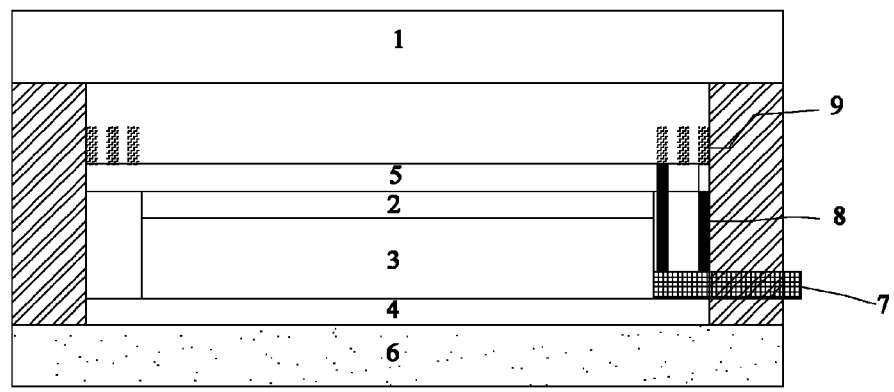
FIG. 5 is a schematic diagram of a mounting structural of the NFC antenna of the OLED display integrated with the NFC antenna according to a fifth embodiment of the disclosure.

FIG. 5 shows a mounting structure of an NFC antenna in an OLED display integrated with the NFC antenna according to a fifth embodiment of the disclosure. The NFC antenna 9 is provided on an outer surface of the first electrode 2 and is insulated from the first electrode 2 by the insulation protective film 5. Other structures are same as those of the fourth embodiment, which are not detailed herein.

According to the above embodiments of the disclosure, the NFC antenna 9 is directly made on the OLED display. The NFC interface of the NFC antenna is built in the output line of the display screen and is connected to the control mainboard (not shown in the figures). Since the NFC antenna is fixed and is not dismantled and mounted frequently once being mounted, the problem of failed signal reception in a conventional NFC antenna due to abrasion or misalignment at the junction is prevented. In addition, a solution is provided for advantageously receiving an NFC signal from a display surface of the display, or for a case that the NFC signal should be received from the display surface of the display. Furthermore, for the electronic product mounted with the above OLED display, the signal is transmitted from a front surface of the display; hence, a selection of materials for a housing is not limited by the NFC antenna.

Incidentally, the structure of the protective member in form of a combination of the rear cover and the desiccant in the first embodiment to the fifth embodiment described above may be replaced by a thin film encapsulation. The thin film encapsulation may also protect OLED display devices. The type of the protective member may be selected depending on cases and is not detailed herein.

With the OLED display integrated with the NFC antenna provided in the disclosure, functions of the display screen and the NFC antenna are integrated as a whole, thereby leading to better market competitiveness.

The above descriptions are only preferred embodiments of the disclosure. It should be noted that the above preferred embodiments should not be regarded as a limitation to the disclosure. The scope of protection of the disclosure is defined by the claims. Numerous variations and modifications may be made by those skilled in the art without departing from the spirit and scope of the disclosure, and these variations and modifications should be also regarded as within the scope of protection of the disclosure.

What is claimed is:

1. An Organic Light-Emitting Diode display integrated with an near field communication antenna, comprising the near field communication antenna provided on a display screen of the Organic Light-Emitting Diode display, wherein an near field communication interface of the near field communication antenna is built in an output line of the display screen and is connected to a control mainboard for the display screen,
the display screen comprises a protective member, a first electrode, an organic luminescent functional layer, a second electrode, and a transparent substrate which are successively arranged, and
the near field communication antenna is led to the output line of the display screen via a conductive material.

2. The Organic Light-Emitting Diode display integrated with the near field communication antenna according to claim 1, wherein the near field communication antenna is provided between the transparent substrate and the second electrode.

3. The Organic Light-Emitting Diode display integrated with the near field communication antenna according to claim 2, wherein the near field communication antenna is connected to the output line via the conductive material.

4. The Organic Light-Emitting Diode display integrated with the near field communication antenna according to claim 1, wherein the near field communication antenna is provided on an outer surface of the transparent substrate and is covered with an insulation protective film.

5. The Organic Light-Emitting Diode display integrated with the near field communication antenna according to claim 4, wherein the near field communication antenna is connected to the output line via the conductive material.

6. The Organic Light-Emitting Diode display integrated with the near field communication antenna according to claim 1, wherein the near field communication antenna is provided on an outer surface of the protective member and is covered with an insulation protective film.

7. The Organic Light-Emitting Diode display integrated with the near field communication antenna according to claim 6, wherein the near field communication antenna is connected to the output line via the conductive material.

8. The Organic Light-Emitting Diode display integrated with the near field communication antenna according to claim 1, wherein the near field communication antenna is provided on an inner surface of the protective member.

9. The Organic Light-Emitting Diode display integrated with the near field communication antenna according to claim 8, wherein the near field communication antenna is connected to the output line via the conductive material.

10. The Organic Light-Emitting Diode display integrated with the near field communication antenna according to claim 1, wherein the near field communication antenna is provided on an outer surface of the first electrode and is insulated from the first electrode by an insulation protective film.

11. The Organic Light-Emitting Diode display integrated with the near field communication antenna according to claim 10, wherein the near field communication antenna is connected to the output line via the conductive material.

12. The Organic Light-Emitting Diode display integrated with the near field communication antenna according to claim 1, wherein the near field communication antenna is connected to the output line via the conductive material.

13. The Organic Light-Emitting Diode display integrated with the near field communication antenna according to claim 1, wherein the near field communication antenna comprises multiturn coils formed through a wiring with a conductive material.

14. The Organic Light-Emitting Diode display integrated with the near field communication antenna according to claim 13, wherein the multiturn coils are wound to have an annular shape matching with an outline of a product.

15. The Organic Light-Emitting Diode display integrated with the near field communication antenna according to claim 14, wherein a layer of transparent ferrite material is covered on a side of the multiturn coil, the side of the multiturn coils being closer to an inner side of the display.

16. The Organic Light-Emitting Diode display integrated with the near field communication antenna according to claim 13, wherein a layer of transparent ferrite material is covered on a side of the multiturn coil, the side of the multiturn coils being closer to an inner side of the display.

* * * * *